United States Patent [19]
Cheah et al.

[11] Patent Number: 6,056,868
[45] Date of Patent: May 2, 2000

[54] RARE EARTH DOPING OF POROUS SILICON

[76] Inventors: Kok Wei Cheah, Department of Physics; Wai Kwok Wong, Department of Chemistry, both of Hong Kong Baptist University, Kowloon Tong, The Hong Kong Special Administrative Region of the People's Republic of China; Meng Lian Gong, Department of Chemistry Zhoongshan University, Guangzhou, China; Wan Han Zheng, Department of Physics Hong Kong Baptist University, Kowloon Tong, The Hong Kong Special Administrative Region of the People's Republic of China

[21] Appl. No.: 09/083,124
[22] Filed: May 22, 1998
[51] Int. Cl.[7] .................................................. H01L 21/02
[52] U.S. Cl. ........................... 205/769; 205/766; 204/515
[58] Field of Search .................................... 205/769, 766; 204/515

[56] References Cited

U.S. PATENT DOCUMENTS 3,919,060  11/1975  Pogge et al. ..................... 204/129.3
5,246,475  9/1993  Edagawa et al. ..................... 65/18.2

FOREIGN PATENT DOCUMENTS 4-07254729  3/1994  Japan .

*Primary Examiner*—Arun S. Phasge
*Attorney, Agent, or Firm*—Jonathan Grant; Grant Patent Services

[57] ABSTRACT

The present invention discloses the doping of rare earth elements into porous silicon, resulting in enhancement of luminescence. The doping is an electro-chemical process using constant voltage bias across the two electrodes in which the anode is porous silicon and the cathode is platinum. The doping process involves a well-defined solution of electrolytes that controls the conductivity of the solution, and set values of constant voltages that selectively allow the desired rare earth elements being doped into porous silicon.

20 Claims, 1 Drawing Sheet

RARE EARTH DOPING OF POROUS SILICON

FIELD OF THE INVENTION

The present invention concerns the doping process of rare earth (RE) elements into porous silicon using a constant voltage electro-chemical method.

BACKGROUND OF THE INVENTION

Porous silicon is a light emitting material that can emit visible light. In its natural state, it is highly resistive., i.e. insulative, and its open structure allows doping of foreign element(s) into porous silicon. Although it has a strong luminescence, its spectrum is broad and therefore not suitable for potential light emitting device application. Doping can change the optical property of porous silicon, producing a narrower bandwidth luminescence spectrum and better color tuning over the visible waveband. There are several doping methods that can be used: co-deposition, ion-implantation, and electro-chemical deposition. The first method is difficult to achieve due to the incompatibility between the fabrication solution and the doping solution.

The second method (ion-implantation) can only be applied to a small area and implantation time is a function of doping depth. In fact, implantation time can be as long as 3 hours or more.

The third method, however, can be used to apply to a large area in a shorter time and compatible existing semiconductor chip processing. With appropriate lithographic masking, light emitting or optoelectronic integrated devices can be produced on a wafer.

SUMMARY OF THE INVENTION

The present invention discloses the doping of rare earth elements into porous silicon, resulting in enhancement of luminescence. The doping is an electro-chemical process using constant voltage bias across the two electrodes in which the anode is porous silicon and the cathode is platinum. In the present invention, the doping process involves a well-defined solution of electrolytes that controls the conductivity of the solution, and set values of constant voltages that selectively allow the desired rare earth being doped into porous silicon. There are two doping conditions and the end results are:

i) An enhancement of visible luminescence by at least on order of magnitude is obtained.

ii) IR emission at RE intra-transition wavelength is obtained.

DETAILED DESCRIPTION OF THE INVENTION

Figure 1:
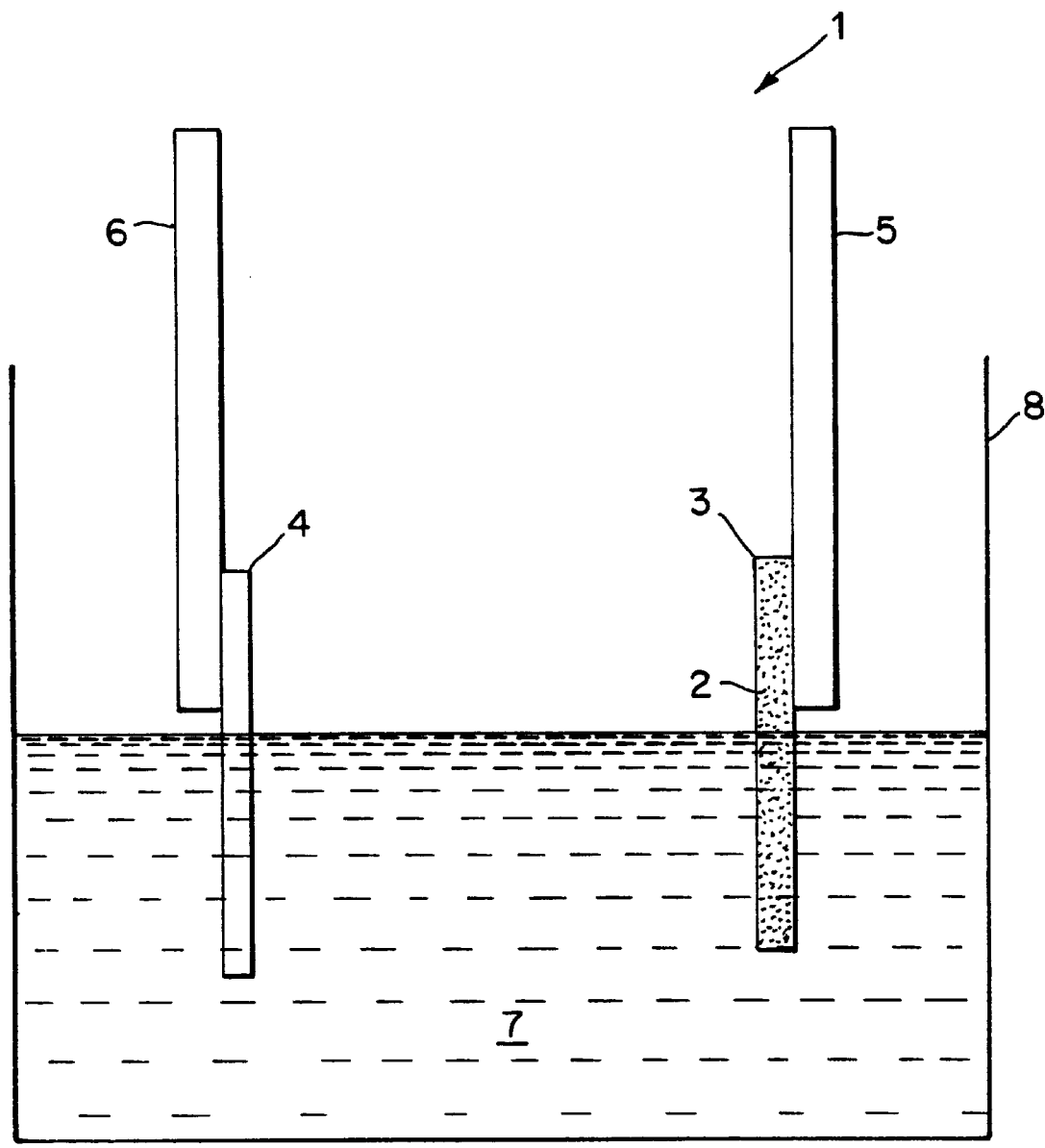
FIG. 1 is a schematic representation of the doping setup.

Referring to FIG. 1, the source material for the doping process 1 is porous silicon 2 that can be fabricated by various methods. The porous silicon 2 can be prepared from both h-type and p-type silicon. The preferred method of preparation is anodization. Using this method the silicon serves as the cathode 3 and the preferred anode 4 is platinum. The cathode 3 and the anode 4 are each attached to connecting electrodes 5 and 6. An etching solution is preferably a mixture of hydrofluoric acid which is used undiluted or mixed with de-ionized water, and ethanol.

A solution of electrolyte 7 is held in a doping container 8. The electrolytic solution preferably contains nitrates of rare earth metals $(RE(NO_3)_3$ having a concentration of 0.1–0.2 mol/L, acetonitrile $(CH_3CN)$-99.7%, and a basic electrolyte, preferably lithium-perchlorate $LiClO_4.3H_2O$-0.05 mol/L.

The doping process uses a constant voltage in the range of about 4 to about 5 volts in the D.C. mode.

The doping time for enhanced visible luminescence is 10 min–60 minutes, and for and about 30 minutes to about 120 minutes for an IR emission.

What is claimed is:

1. A method for doping rare earth elements into porous silicon, comprising an electro-chemical method, wherein a constant voltage bias is passed between two electrodes in an electrolyte solution.

2. The method for doping rare earth elements into porous silicon according to claim 1, wherein one of said two electrodes is an cathode comprising the porous silicon, and another of said two electrodes is an anode comprising platinum.

3. The method for doping rare earth elements into porous silicon according to claim 2, further comprising preparing said porous silicon from the group selected from h-type silicon and p-type silicon.

4. The method for doping rare earth elements into porous silicon according to claim 3, further comprising preparing said porous silicon by use of an etching solution.

5. The method for doping rare earth elements into porous silicon according to claim 4, wherein said etching solution is hydrofluoric acid.

6. The method for doping rare earth elements into porous silicon according to claim 1, further comprising having the nitrates of rare earth elements in the electrolyte solution.

7. The method for doping rare earth elements into porous silicon according to claim 6, wherein the concentration of nitrates of rare earth in said electrolyte solution is 0.1–0.2 mol/L.

8. The method for doping rare earth elements into porous silicon according to claim 6, further comprising passing a constant voltage in the range of about 4 to about 5 volts between the electrodes in the solution of electrolytes.

9. The method for doping rare earth elements into porous silicon according to claim 8, further comprising having a doping time of from about 10 minutes to about 60 minutes for enhanced visible luminescence.

10. The method for doping rare earth elements into porous silicon according to claim 8, further comprising having a doping time of from about 30 minutes to about 120 minutes for infrared emission.

11. An electro-chemical method for doping rare earth elements into porous silicon, comprising:

preparing said porous silicon by use of an etching solution;

preparing an electrolytic solution containing nitrates of the rare earth element and acetonitrile;

placing two electrodes in said electrolytic solution;

and passing a constant potential between said two electrodes in said electrolytic solution, wherein one of said two electrodes is a cathode comprising the porous silicon, and another of said two electrodes is an anode comprising platinum.

12. An electro-chemical method for doping rare earth elements into porous silicon, comprising:

preparing said porous silicon by use of an etching solution;

preparing an electrolytic solution comprising nitrates of the rare earth elements;

placing two electrodes in said electrolytic solution;

and passing a constant voltage potential between said two electrodes in said electrolytic solution, wherein one of said two electrodes is a cathode comprising the porous silicon, and another of said two electrodes is an anode comprising platinum.

13. The method for doping rare earth elements into porous silicon according to claim 12, further comprising preparing said porous silicon from the group selected from h-type silicon and p-type silicon.

14. The method for doping rare earth elements into porous silicon according to claim 12, wherein said etching solution is hydrofluoric acid.

15. The method for doping rare earth elements into porous silicon according to claim 12, wherein the concentration of nitrates of rare earth in said electrolyte solution is 0.1–0.2 mol/L.

16. The method for doping rare earth elements into porous silicon according to claim 15, wherein said electrolytic solution further comprises acetonitrile.

17. The method for doping rare earth elements into porous silicon according to claim 15, wherein said electrolytic solution further comprises a basic electrolyte.

18. The method for doping rare earth elements into porous silicon according to claim 12, further comprising passing a constant voltage in the range of about 4 to about 5 volts between the electrodes in the solution of electrolytes.

19. The method for doping rare earth elements into porous silicon according to claim 18, further comprising having a doping time of from about 10 minutes to about 60 minutes for enhanced visible luminescence.

20. The method for doping rare earth elements into porous silicon according to claim 19, further comprising having a doping time of from about 30 minutes to about 120 minutes for infrared emission.

* * * * *

UNITED STATES PATENT AND TRADEMARK OFFICE
CERTIFICATE OF CORRECTION

PATENT NO.    : 6,056,868
DATED         : May 2, 2000
INVENTOR(S)   : Donald E. Weder et al.

Page 1 of 1

It is certified that error appears in the above-identified patent and that said Letters Patent is hereby corrected as shown below:

Column 1,
Line 40, change "the anode is" to -- the cathode is --, and change "and the cathode is" to -- and the anode is --;
Line 47, change "on" to -- one --;
Line 61, change "h-type" to -- n-type --;
Line 63, change "as the cathode" to -- as the anode --, and change "the preferred anode" to -- the preferred cathode --.

Column 2,
Line 9, change "and for and about" to -- and four about --;
Line 24, change "h-type" to -- n-type --;

Column 3,
Line 14, change "h-type" to -- n-type --.

Signed and Sealed this

Seventh Day of May, 2002

Attest:

JAMES E. ROGAN
*Attesting Officer*                *Director of the United States Patent and Trademark Office*

UNITED STATES PATENT AND TRADEMARK OFFICE
CERTIFICATE OF CORRECTION

| | | |
|---|---|---|
| PATENT NO. | : 6,056,868 | Page 1 of 2 |
| APPLICATION NO. | : 09/083124 | |
| DATED | : May 2, 2000 | |
| INVENTOR(S) | : Kok Wai Cheah et al. | |

It is certified that error appears in the above-identified patent and that said Letters Patent is hereby corrected as shown below:

<u>Title Page, item [76], Inventors,</u>
Change "Kok Wei Cheah" to --Kok Wai Cheah--;
Change "Zhoongshan" to --Zhongshan--
Change "Wan Han Zheng" to --Wan Hua Zheng--

<u>Title Page, item [57], Abstract,</u>
Amend the Abstract as follows:
The present invention discloses the doping of rare earth elements into porous silicon, resulting in enhancement of luminescence. The doping is an electro-chemical process using constant voltage bias across the two electrodes in which the [anode] <u>cathode</u> is porous silicon and the [cathode] <u>anode</u> is platinum. The doping process, involves a well-defined solution of electrolytes that controls the conductivity of the solution, and set values of constant voltages that selectively allow the desired rare earth elements being doped into porous silicon.

<u>Column 1,</u>
Line 40, change "the anode is" to -- the cathode is --, and change "and the cathode is" to -- and the anode is --;
Line 47, change "on" to -- one --;
Line 61, change "h-type" to -- n-type --;
Line 63, change "as the cathode" to -- as the anode --, and change "the preferred anode" to -- the preferred cathode --.

<u>Column 2,</u>
Line 9, change "and for and about" to-- and four about --;
Line 24, change "h-type" to -- n-type --;

UNITED STATES PATENT AND TRADEMARK OFFICE
CERTIFICATE OF CORRECTION

PATENT NO. : 6,056,868
APPLICATION NO. : 09/083124
DATED : May 2, 2000
INVENTOR(S) : Kok Wai Cheah et al.

It is certified that error appears in the above-identified patent and that said Letters Patent is hereby corrected as shown below:

Column 3,
Line 14, change "h-type" to -- n-type --.

This certificate supersedes Certificate of Correction issued May 7, 2002.

Signed and Sealed this

Fourth Day of September, 2007

JON W. DUDAS
*Director of the United States Patent and Trademark Office*